United States Patent [19]

Nate et al.

[11] 4,419,506

[45] Dec. 6, 1983

[54] RADIATION SENSITIVE POLYMER MATERIALS

[75] Inventors: Kazuo Nate, Machida; Toshio Kobayashi, Tokyo; Tokio Isogai, Fujisawa, all of Japan

[73] Assignee: Hitachi, Ltd., Tokyo, Japan

[21] Appl. No.: 359,511

[22] Filed: Mar. 18, 1982

[30] Foreign Application Priority Data

Mar. 27, 1981 [JP] Japan .................................. 56-44032

[51] Int. Cl.³ .................. C08F 116/36; C08F 212/00; C08F 216/36
[52] U.S. Cl. .................................... 526/316; 430/270; 430/296; 430/326; 526/296; 526/310; 526/313; 526/293
[58] Field of Search ............... 526/316, 296, 310, 313, 526/293

[56] References Cited

U.S. PATENT DOCUMENTS

| | | | |
|---|---|---|---|
| 3,853,814 | 12/1974 | Guillet | 526/316 |
| 3,860,538 | 1/1975 | Guillet et al. | 526/316 |
| 3,925,269 | 12/1975 | Miyoshi et al. | 525/316 |
| 4,054,454 | 10/1977 | Himics et al. | 430/270 |

FOREIGN PATENT DOCUMENTS 983200  2/1976  Canada .................. 526/316

OTHER PUBLICATIONS

J. Voc. Sci. Technology (16/16), Nov., Dec. 1979, M. Hatzakis.

Primary Examiner—Joseph L. Schofer
Assistant Examiner—Peter F. Kulkosky
Attorney, Agent, or Firm—Antonelli, Terry & Wands

[57] ABSTRACT

A radiation sensitive polymer material having (a) one or more repeating units of the formula:

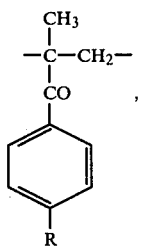

wherein R is an alkyl group, a halogen atom, a hydrogen atom or a dimethylamino group, and (b) an addition polymerizable repeating unit derived from a compound having a $CH_2=C<$ group in the molecule, can give a positive type resist having excellent resistance to dry etching and being highly sensitive to radiation.

17 Claims, 1 Drawing Figure

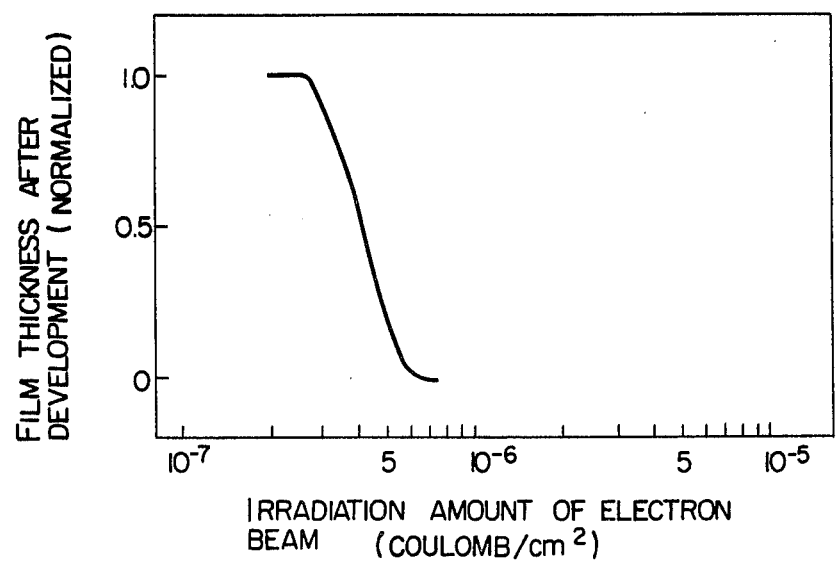

RADIATION SENSITIVE POLYMER MATERIALS

BACKGROUND OF THE INVENTION (i) Field of the Invention

The present invention relates to radiation sensitive polymer materials, particularly positive type radiation sensitive polymer materials having high radiation sensitivity.

(ii) Description of the Prior Art

In recent years, there is a tendency to require integrated circuits (IC) having higher density and higher integration. In the manufacture of IC, the formation of fine resist patterns having line width of less than 1 $\mu$m is thus required.

Radiation sensitive resists sensitive to radiations such as electron beams, X-rays and ion beams are suitable for the formation of fine resist patterns.

There are two types of radiation sensitive resists, namely negative type and positive type.

Radiation sensitive resists of negative type can, considering their reaction mechanism, inherently withstand influences caused by dry etching which is conducted at the time of fine pattern formation, and are good in sensitivity but poor in resolution.

On the other hand, radiation sensitive resists of positive type are inherently better in resolution than the negative type, considering the reaction mechanism. However, these positive type resists are attacked at their end portions in dry etching operation, and poorer in sensitivity than the negative type resists.

SUMMARY OF THE INVENTION

An object of this invention is to provide a radiation sensitive polymer material for positive type resists overcoming disadvantages of the prior art wherein the resolution of it is as good as that of conventional positive type radiation sensitive resists and the sensitivity and resistance to attack in dry etching operation are improved close to respective levels of conventional negative type radiation sensitive resists.

The above object can be achieved by the use of polymers having aromatic rings. When these polymers are subjected to irradiation of radiations such as electron beam, X-rays and ion beam, their molecular chains are cut effectively and thereby sensitivity improves. Also, they become less susceptible to attack in dry etching. The sensitivity is further improved when the polymers having aromatic rings possess substituents at the para-position. The sensitivity can be improved much further when the polymers having aromatic rings are used together with hydrates of metal chlorides or hydrates of metal nitrates.

The present invention provides the following radiation sensitive polymer material [I].

Polymer material [I]

A radiation sensitive polymer having (a) 10 to 100% by mole of one or more repeating units of the formula:

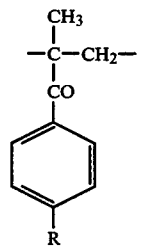

wherein R is a hydrogen atom, a lower alkyl group preferably having 1 to 6 carbon atoms, a lower alkoxy group preferably having 1 to 6 carbon atoms, a halogen atom, or a dialkylamino group, and (b) 90 to 0% by mole of an addition polymerizable repeating unit derived from a compound having $CH_2=C<$ group in the molecule.

BRIEF DESCRIPTION OF THE DRAWING

The attached drawing is a graph showing a relationship between the electron beam quantity irradiated to a positive type radiation sensitive polymer material according to the present invention and its film thickness after development.

DESCRIPTION OF PREFERRED EMBODIMENTS

In the above polymer material [I] when there is present in the polymer the addition polymerizable repeating unit derived from a compound having $CH_2=C<$ group in an amount more than 90% by mole, the sensitivity of the polymer to radiation such as electron beam, X-rays, ion beam, etc., becomes low and the resistance to dry etching is lowered remarkably.

The polymer having (a) one or more repeating units of the formula (1) and (b) the addition polymerizable repeating unit is explained in detail below.

In the formula (1), the lower alkyl group includes methyl, ethyl, propyl, and the like, the lower alkoxy group includes methoxy, ethoxy, propoxy, and the like, the halogen atoms includes chlorine, bromine, iodine, and the like, and the dialkylamino group wherein the dialkyl moiety preferably having 2 to 6 carbon atoms includes dimethylamino, diethylamino, and the like.

Preferable examples of the repeating units represented by the formula (1) include the followings:

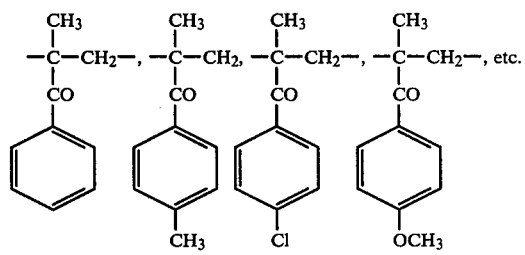

These repeating units may be present in the polymer as the component (a) singly or in combination of two or more of them.

The addition polymerizable repeating unit (b) can be represented by the formula:

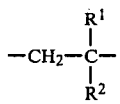

wherein $R^1$ is a lower alkyl group preferably having 1 to 3 carbon atoms or a phenyl group; $R^2$ is —COOR$^3$ (in which $R^3$ is $C_{1-6}$ alkyl or phenyl), —COOH, —CN, —COR$^4$ (in which $R^4$ is $C_{1-6}$ alkyl),

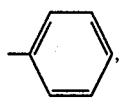

or a lower alkyl group preferably having 1 to 6 carbon atoms. The repeating unit of the formula (2) can be derived from a compound having $CH_2=C<$ group in the molecule.

Preferable examples of the compounds each having $CH_2=C<$ group in the molecule which can give an addition polymerizable repeating unit are alkyl esters of methacrylic acid such as methyl methacrylate, ethyl methacrylate, propyl methacrylate, isopropyl methacrylate, butyl methacrylate, isobutyl methacrylate, t-butyl methacrylate, cyclohexyl methacrylate, etc.; methacrylic acid; methacrylonitrile; ketones such as methyl isopropenyl ketone; styrene derivatives such as α-methylstyrene; isobutylene; phenyl methacrylate, etc. Among these compounds, methacrylic acid, methyl methacrylate, methacrylonitrile and methyl isopropenyl ketone are more preferable. Each of these compounds can be used singly.

Preferable examples of the polymer having the repeating units of the formulas (1) and (2) are as follows:

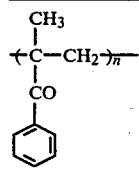  (molecular weight (M.W.) 50,000)

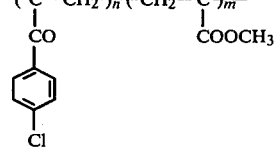  (MW 80,000, copolymerization ratio (CPR) 0.5/0.5)

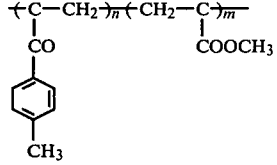  (MW 30,000, CPR 0.5/0.5)

-continued

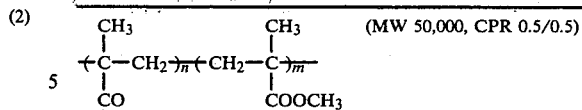  (MW 50,000, CPR 0.5/0.5)

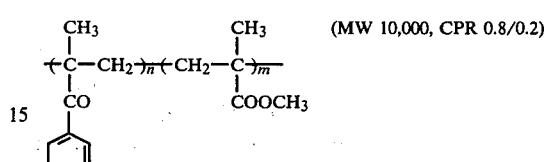  (MW 10,000, CPR 0.8/0.2)

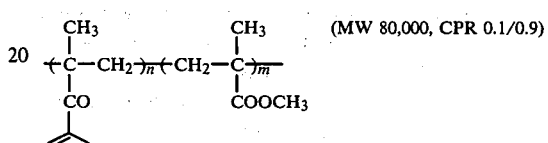  (MW 80,000, CPR 0.1/0.9)

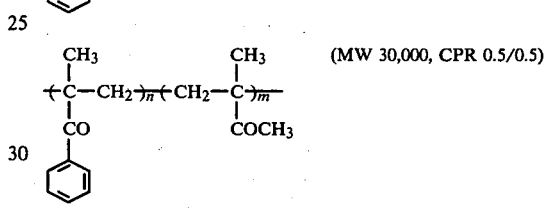  (MW 30,000, CPR 0.5/0.5)

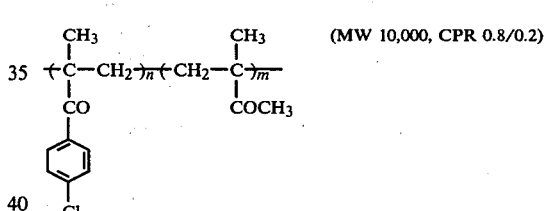  (MW 10,000, CPR 0.8/0.2)

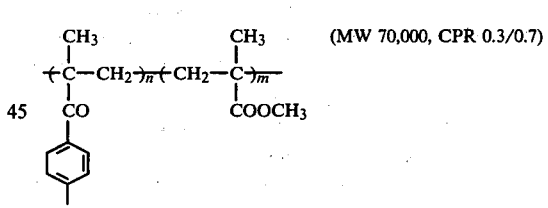  (MW 70,000, CPR 0.3/0.7)

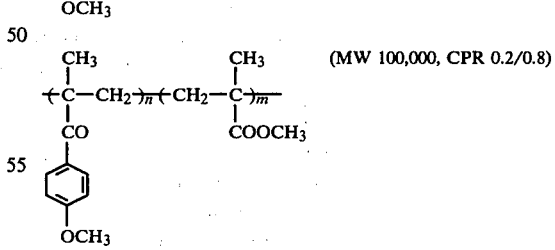  (MW 100,000, CPR 0.2/0.8)

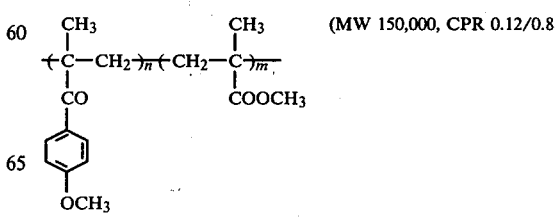  (MW 150,000, CPR 0.12/0.88)

The polymer having the repeating units of the formulas (1) and (2) itself has good sensitivity to radiation and can be used alone or together with one or more additives such as metal compounds having a sensitizing effect.

The polymer material [I] is used as a positive type resist material by dissolving it in a conventional organic solvent such as toluene, methyl isobutyl ketone or N-methylpyrrolidone and the like.

Hereinunder, the present invention is further explained in detail referring to Examples. Raw materials used for preparing organic polymers having the repeating unit represented by the formula (1) were synthesized as follows.

SYNTHESIS EXAMPLE 1

There were mixed 13.4 g of propiophenone, 4.5 g of paraformaldehyde, 12.2 g of piperidine hydrochloride, 0.25 cc of concentrated hydrochloric acid and 50 cc of ethanol. The mixture was refluxed for about 1 hour, and after addition of another 4.5 g of paraformaldehyde, the whole mixture was further refluxed for about 2 hours. This mixture was subjected to recrystallization from an acetone-ethanol solution to obtain phenyl β-piperidino isopropyl ketone hydrochloride (white, needle-like crystals).

Next, 10 g of this salt was heated at 200° C. for 3 hours in 50 ml of N-methylpyrrolidone. After cooling and washing, phenyl isopropenyl ketone was obtained by distillation under reduced pressure (b.p.: 35° to 50° C./1 mmHg).

SYNTHESIS EXAMPLE 2

In a 1-liter three-necked flask were placed 92 g of toluene, 300 ml of carbon disulfide and 147 g of anhydrous aluminum chloride powder. To this, was added dropwise slowly in about 1 hour 130 g of propionic anhydride with mechanical stirring. The resulting mixture was refluxed for 3 hours until there was no generation of HCl gas. After having been allowed to cool, the above reaction solution was transferred into 500 ml of an icewater cooling medium, and the organic solvent layer in the solution was extracted with ether.

Next, this ether layer was water-washed, dried by an ordinary method to remove the water and distilled under reduced pressure to obtain p-methylpropiophenone (b.p.: 85° to 90° C./4 mmHg).

Next, there were mixed 14.8 g of p-methylpropiophenone, 4.5 g of paraformaldehyde, 12.2 g of piperidine hydrochloride, 0.25 ml of concentrated hydrochloric acid and 50 ml of absolute ethanol. The mixture was refluxed for about 1 hour and, after further addition of 3.0 g of paraformaldehyde, the whole mixture was refluxed for about 3 hours. After cooling, the above reaction solution was subjected to recrystallization from an acetone-ethanol solution in the same manner as described in Synthesis Example 1, to obtain white, needle-like crystals of α-piperidinomethyl-p-methylpropiophenone hydrochloride. Subsequently, 26.8 g of the above salt and 12.3 g of potassium t-butoxide were refluxed for about 5 hours in 100 ml of t-butanol.

Next, to the above reaction solution was added 200 ml of water. The mixture was extracted with ether and the extract was dried over a desiccating agent and subjected to distillation under reduced pressure to obtain p-methylphenyl isopropenyl ketone (b.p.: 70° to 80° C./1 to 2 mmHg).

SYNTHESIS EXAMPLE 3

In a 1-liter three-necked flask were placed 108 g of anisole, 300 ml of carbon disulfide and 147 g of anhydrous aluminum chloride powder. To this, was added dropwise slowly in about 1 hour 130 g of propionic anhydride with mechanical stirring. The whole mixture was refluxed for 5 hours until there was no generation of HCl gas. After having been allowed to cool, the above reaction solution was subjected to the same procedure as described in Synthesis Example 2 to obtain p-methoxypropiophenone (b.p.: 115° to 118° C./4 mmHg).

Next, there were mixed 16.4 g of p-methoxypropiophenone, 4.5 g of paraformaldehyde, 12.2 g of piperidine hydrochloride, 0.25 ml of concentrated hydrochloric acid and 50 ml of absolute ethanol. This mixture was refluxed for about 1 hour and, after further addition of 3.0 g of paraformaldehyde, the whole mixture was refluxed for about 5 hours. Subsequently, this reaction solution was subjected to recrystallization from an acetone-ethanol solution in the same manner as described in Synthesis Example 2, to obtain white, needle-like crystals of α-piperidinomethyl-p-methoxypropiophenone hydrochloride.

Subsequently, 28.4 g of the above salt and 12.3 g of potassium-t-butoxide were refluxed for about 4 hours in 100 ml of t-butanol. After having been allowed to cool, this mixture was distilled under reduced pressure in the same manner as described in Synthesis Example 1 to give p-methoxyphenyl isopropenyl ketone (b.p.: 113° to 115° C./2 mmHg).

SYNTHESIS EXAMPLE 4 p-Chlorophenyl isopropenyl ketone, p-bromophenyl isopropenyl ketone and p-iodophenyl isopropenyl ketone were synthesized by using the same procedures as described in Synthesis Examples 1 to 3. Namely, firstly p-halogenated propiophenone was synthesized by the Friedel-Crafts reaction by using propionyl chloride instead of propionic anhydride. Subsequently, by the Mannish reaction was obtained white crystals of α-piperidinomethyl-p-halogenated propiophenone hydrochloride. Lastly, by a deamination reaction was obtained p-halogenated phenyl isopropenyl ketone.

EXAMPLE 1

Using 0.1 g of azobisisobutyronitrile as a polymerization initiator, 10 g of phenyl isopropenyl ketone obtained in Synthesis Example 1 was statically polymerized at 80° C. for 10 hours in a sealed tube containing nitrogen gas.

The polymer obtained was dissolved in about 10 ml of methyl isobutyl ketone. The solution obtained was transferred into about 500 ml of methanol to give a white precipitate of the above polymer. The weight average molecular weight of the polymer measured by liquid chromatography was about 50,000 in terms of that of polystyrene.

The polymer obtained was dissolved in methyl isobutyl ketone to obtain a resist solution wherein the solid polymer content was 15% by weight. Subsequently, this solution was spin-coated on a silicon wafer at 2000 rpm to form a polymer film of 0.8 μm thick.

The wafer obtained was prebaked at 150° C. for 30 minutes and then transferred to an electron beam irradiation apparatus wherein an electron beam having an acceleration voltage of 15 kV was applied to the prebaked wafer in vacuum so as to give different dosages to different portions. Then, the wafer was taken out from the apparatus and dipped for 2 minutes in a developer consisting of methyl isobutyl ketone and isopropyl alcohol (35:65 by volume) for development. The wafer developed was rinsed with isopropyl alcohol to dissolve the irradiated portions. Thicknesses of the polymer film which had different thickness in portions dependng upon different dosages were measured by the use of a Talystep (a thin film level difference meter, mfd. by Taylor Hobson Ltd., U.K.). Film thicknesses of retained portions after development (normalized) were plotted against irradiation amounts (exposure dose) of the electron beam (coulomb/cm$^2$), by which a curve showing sensitivity to electron beam as shown in the attached drawing was obtained. The minimum exposure dose giving zero film thickness was obtained from the drawing to be $6 \times 10^{-6}$ coulomb/cm$^2$. Thus, the polymer of the present invention had a sensitivity 10 times or more as high as that of, for example, poly(methyl methacrylate).

Subsequently, the wafer was subjected to ion etching under an argon gas pressure of $2.0 \times 10^{-4}$ Torr and ion energy density of 0.25 W/cm$^2$. The polymer of the present invention showed an ion etching speed of 150 Å/min compared to 200 Å/min in the case of a silicon oxide film. This indicates that ething of the substrate becomes possible by coating resist film of the present polymer having a thickness of at least two times that of the silicon oxide film, considering non-uniformity of etching and the like.

EXAMPLE 2

Using 0.1 g of azobisisobutyronitrile as a polymerization initiator, 8 g of p-chlorophenyl isopropenyl ketone obtained in Synthesis Example 4 and 5 g of methyl methacrylate were statically polymerized at 80° C. for 6 hours in a sealed tube containing enclosed nitrogen gas. The copolymer obtained was refined in the same manner as described in Example 1 to obtain a white precipitate. Measurement by liquid chromatography revealed that the copolymer had a weight average molecular weight of about 80,000 in terms of that of polystyrene. Also, measurement of NMR spectrum for this copolymer dissolved in an acetone-d$_6$ solution revealed that the copolymer contained 50% by mole of p-chlorophenyl isopropenyl ketone.

The copolymer was dissolved in methyl isobutyl ketone to obtain a resist solution containing 15% by weight of the copolymer. In the same manner as described in Example 1, a polymer film of 1.0 μm thick was formed on a silicon wafer at 2000 rpm by the spin coating method.

The silicon wafer was prebaked at 150° C. for 30 minutes. Then, the prebacked wafer was kept in a sample room maintained at $10^{-3}$ Torr and was subjected to irradiation of soft X-rays having a wavelength of 5.4 Å supplied from a molybdenum anticathode of rotational water cooling type (acceleration voltage: 10 kV, 500 mA) with varying exposure doses.

The wafer irradiated was dipped in a developer consisting of methyl isobutyl ketone and isopropyl alcohol (35:65 by volume) for 2 minutes for development. Then, the wafer was rinsed with isopropyl alcohol to dissolve the irradiated portions.

In the same manner as described in Example 1, retained film thicknesses after development (normalized) were plotted against exposure dose. From the curve obtained, the minimum exposure dose giving zero film thickness was found to be 30 mJ/cm$^2$. This fact indicates that the above resist had high sensitivity as a positive type resist. Also, ion etching was applied under argon gas in the same manner as in Example 1. This polymer gave an ion etching speed of 170 Å/min which showed the excellency of the polymer in ion etching resistance.

EXAMPLE 3

Using the same procedures as described in Examples 1 and 2, polymers of various compositions (polymer Nos. 1 to 9 in Table 1) were obtained by radical polymerization at 80° C. for 10 hours using as a polymerization initiator azobisisobutyronitrile. The polymers were refined in the same manner as described in Example 1. Then, polymers Nos. 1, 2, 3, 5, 6 and 7 were dissolved in methyl isobutyl ketone to give 15% by weight solutions, and polymers Nos. 4, 8 and 9 were dissolved in toluene to give 10% by weight solutions. Each polymer solution obtained was applied to a silicon wafer by the spin coating method to form a polymer film of about 1 μm thick.

Subsequently, the sensitivity of each polymer-applied wafer to an electron beam with an acceleration voltage of 15 kV was measured. Also, the ion etching resistance of each polymer-applied wafer was measured from the wafer's ion etching speed in ion etching under argon gas. these results are summarized in Table 1.

As is clear from Table 1, all positive type resists showed high sensitivity to the radiation and excellent dry etching resistance.

TABLE 1

| Run No. | Radiation sensitive polymer material* | Molecular weight | Developer | Sensitivity to electron beam (μ coulomb/cm$^2$) | Ion etching speed (Å/min) |
|---|---|---|---|---|---|
| 1 | p-Methylphenyl isopropenyl ketone [50]/methyl methanylate [50] copolymer | 30,000 | Methyl isobutyl ketone/isopropyl alcohol (50/50 by volume) | 3 | 190 |
| 2 | p-Methoxyphenyl isopropenyl ketone [50]/methyl methacrylate [50] copolymer | 50,000 | Methyl isobutyl ketone/isopropyl alcohol (50/50 by volume) | 2 | 180 |
| 3 | Phenyl isopropenyl ketone [80]/methyl methacrylate [20] copolymer | 10,000 | Methyl isobutyl ketone/isopropyl alcohol (20/80 by volume) | 5 | 160 |
| 4 | Phenyl isopropenyl ketone [10]/methyl methacrylate [90] copolymer | 80,000 | Methyl isobutyl ketone/isopropyl alcohol (35/65 by volume) | 9 | 210 |
| 5 | Phenyl isopropenyl ketone [50]/methyl isopropenyl ketone [50] copolymer | 30,000 | Methyl isobutyl ketone/isopropyl alcohol (35/65 by volume) | 8 | 190 |
| 6 | p-Chlorophenyl isopropenyl ketone [80]/methyl isopropenyl ketone [20] copolymer | 10,000 | Methyl isobutyl ketone/isopropyl alcohol (35/65 by volume) | 7 | 170 |
| 7 | p-Methoxyphenyl isopropenyl ketone [30]/methyl methacrylate [70] copolymer | 70,000 | Methyl isobutyl ketone/isopropyl alcohol (60/40 by volume) | 1 | 190 |
| 8 | p-Methoxyphenyl isopropenyl ketone [20]/methyl | 100,000 | Methyl isobutyl ketone/isopropyl | 3 | 200 |

TABLE 1-continued

| Run No. | Radiation sensitive polymer material* | Molecular weight | Developer | Sensitivity to electron beam ($\mu$ coulomb/cm$^2$) | Ion etching speed (Å/min) |
|---|---|---|---|---|---|
| 9 | p-Methoxyphenyl isopropenyl ketone [12]/methyl methacrylate [80] copolymer methacrylate [88] copolymer | 150,000 | alcohol (60/40 by volume) Methyl isobutyl ketone/isopropyl alcohol (60/40 by volume) | 10 | 210 |

Note
*Values in [ ] in this column represent mole percentages in copolymers. These values were obtained from NMR spectra.

COMPARATIVE EXAMPLE 1

Similarly to Example 1, polymers shown in Table 3 (these being outside the present invention) were obtained by radical polymerization at 80° C. for 10 hours by using as a polymerization initiator azobisisobutyronitrile. Each polymer obtained was refined similarly to Examples mentioned above and the refined polymer was dissolved in toluene to give a 10% by weight solution. Each polymer solution obtained was applied to a silicon wafer by the spin coating method to give a polymer film of about 1 μm thick.

Subsequently, the sensitivity of this polymer film to an electron beam with an acceleration voltage of 15 kV was measured. Also, the ion etching speed of this polymer film in the case of ion etching under argon gas was measured. These results were shown in Table 3. As is clear from Table 3, the polymers of this Comparative Example were all poor in sensitivity to the radiation and also in dry etching resistance, and hence these polymers could not be put into practical use.

TABLE 3

| Run No. | Radiation sensitive polymer material* | Molecular weight | Developer | Sensitivity to electron beam ($\mu$ coulomb/cm$^2$) | Ion etching speed (Å/min) |
|---|---|---|---|---|---|
| 28 | Phenyl isopropenyl ketone [5]/methyl methacrylate [95] copolymer | 100,000 | Methyl isobutyl ketone/isopropyl alcohol (35/65 by Volume | 30 | 300 |
| 29 | Phenyl isopropenyl ketone [2]/methyl methacrylate [98] copolymer | 150,000 | Methyl isobutyl ketone/isopropyl alcohol (35/65 by Volume) | 70 | 370 |

Note
*values in [ ] in this column represent mole percentages in copolymers. These values were obtained from NMR spectra.

What is claimed is:

1. A radiation sensitive polymer material for producing a positive type resist having improved radiation sensitivity which consists essentially of (a) 10 to 100% by mole of one or more repeating units of the formula:

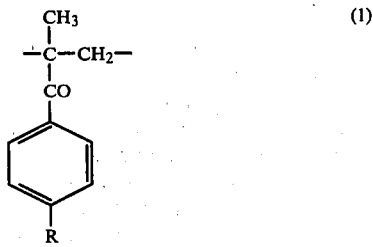

(1)

wherein R is a hydrogen atom, a lower alkyl group, a lower alkoxy group, a halogen atom, or a dialkylamino group, and (b) 90 to 0% by mole of an addition polymerizable repeating unit derived from a compound having a CH$_2$=C< group in the molecule.

2. A radiation sensitive polymer material according to claim 1, wherein the addition polymerizable repeating unit is represented by the formula:

(2)

wherein R$^1$ is a lower alkyl group or a phenyl group; and R$^2$ is —COOR$^3$ (in which R$^3$ is a lower alkyl group or a phenyl group), —COOH, —CN, —COR$^4$ (in which R$^4$ is a lower alkyl group), a phenyl group or a lower alkyl group.

3. A radiation sensitive polymer material according to claim 1, wherein R in the formula (1) is a hydrogen atom, a methyl group, a methoxy group, a chlorine atom, a bromine atom, an iodine atom, or a dimethylamino group.

4. A radiation sensitive polymer material according to claim 1, wherein the compound having CH$_2$=C< group in the molecule is one member selected from the group consisting of methacrylic acid, an alkyl ester of methacrylic acid, methacrylonitrile, a ketone, a styrene derivative, isobutylene, and phenyl methacrylate.

5. A radiation sensitive polymer material according to claim 4, wherein the compound is methyl methacrylate, ethyl methacrylate, propyl methacrylate, isopropyl methacrylate, butyl methacrylate, isobutyl methacrylate, t-butyl methacrylate, cyclohexyl methacrylate, methacrylic acid, methacrylonitrile, methyl isopropenyl ketone, α-methylstyrene, isobutylene or phenyl methacrylate.

6. A radiation sensitive polymer material according to claim 1, wherein the repeating unit represented by the formula (1) is any one of

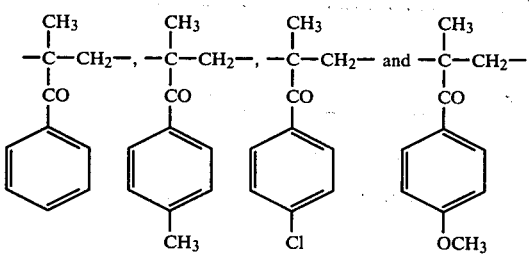

and the addition polymerizable repeating unit is derived from one compound selected from methacrylic acid, methyl methacrylate, methacrylonitrile and methyl isopropenyl ketone.

7. A radiation sensitive polymer material according to claim 1, wherein the repeating unit represented by the formula (1) is any one of

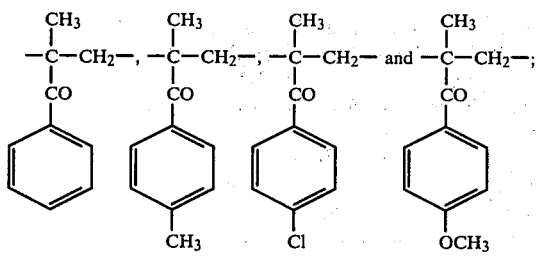

and the addition polymerizable repeating unit is derived from one compound selected from methacrylic acid, methyl methacrylate, methacrylonitrile and methyl isopropenyl ketone.

8. A radiation sensitive polymer material for producing a positive type resist having improved radiation sensitivity which consists essentially of (a) 10 to 100% by mole of one or more repeating units represented by the formula:

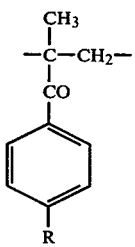
(1)

wherein R is a hydrogen atom, a methyl group, a methoxy group, a chlorine atom, a bromine atom, an iodine atom or a dimethylamino group, and (b) 90 to 0% by mole of an addition polymerizable repeating unit derived from a compound having a $CH_2=C<$ group in the molecule.

9. A radiation sensitive polymer material according to claim 8, wherein the addition polymerizable repeating unit is derived from one compound selected from methyl methacrylate, ethyl methacrylate, propyl methacrylate, isopropyl methacrylate, butyl methacrylate, isobutyl methacrylate, t-butyl methacrylate, cyclohexyl methacrylate, methacrylic acid, methacrylonitrile, methyl isopropenyl ketone, α-methylstyrene, isobutylene and phenyl methacrylate.

10. A radiation sensitive polymer material according to claim 8, wherein the repeating unit represented by the formula (1) is any one of

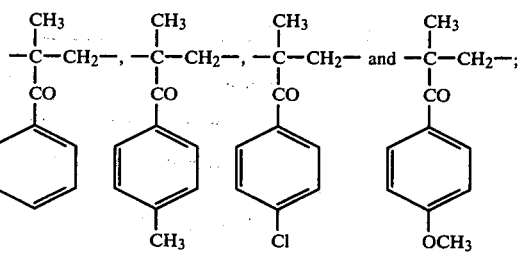

the addition polymerizable repeating unit is derived from one compound selected from methacrylic acid, methyl methacrylate, methacrylonitrile and methyl isopropenyl ketone.

11. A radiation sensitive polymer material for producing a positive type resist having improved radiation sensitivity which consists essentially of (a) 20 to 100% by mole of one or more repeating units of the formula:

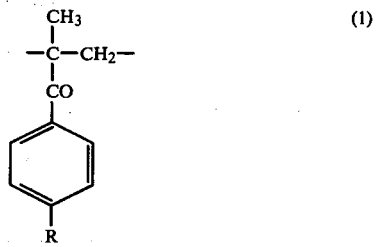
(1)

wherein R is a lower alkyl group, a lower alkoxy group, a halogen atom, or a dialkylamino group, and (b) 80 to 0% by mole of an addition polymerizable repeating unit derived from a compound having a $CH_2=C<$ group in the molecule.

12. A radiation sensitive polymer material according to claim 11, wherein the addition polymerizable repeating unit is represented by the formula:

(2)

wherein $R^1$ is a lower alkyl group or a phenyl group; and $R^2$ is $-COOR^3$ (in which $R^3$ is a lower alkyl group or a phenyl group), $-COOH$, $-CN$, $-COR^4$ (in which $R^4$ is a lower alkyl group), a phenyl group or a lower alkyl group.

13. A radiation sensitive polymer material according to claim 11, wherein R in the formula (1) is a methyl group, a methoxy group, a chlorine atom, a bromine atom, an iodine atom, or a dimethylamino group.

14. A radiation sensitive polymer material according to claim 11, wherein the compound having a $CH_2=C<$ group in the molecule is one member selected from the group consisting of methacrylic acid, an alkyl ester of methacrylic acid, methacrylonitrile, a ketone, a styrene derivative, isobutylene, and phenyl methacrylate.

15. A radiation sensitive polymer material according to claim 11, wherein the compound is methyl methacrylate, ethyl methacrylate, propyl methacrylate, isopropyl methacrylate, butyl methacrylate, isobutyl methacrylate, t-butyl methacrylate, cyclohexyl methacrylate, methacrylic acid, methacrylonitrile, methyl isopropenyl ketone, α-methylstyrene, isobutylene or phenyl methacrylate.

16. A radiation sensitive polymer material according to claim 11, wherein the repeating unit represented by the formula (1) is any one of

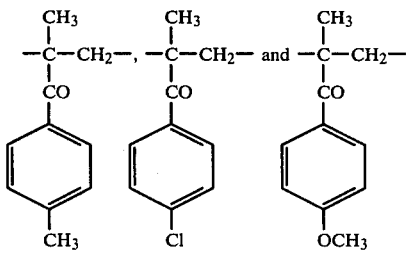

17. A radiation sensitive polymer material according to claim 11, wherein the repeating unit represented by the formula (1) is any one of

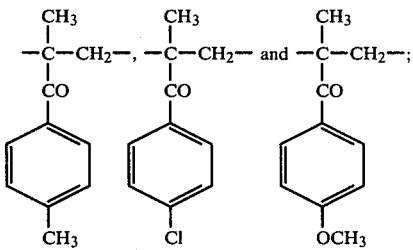

and the addition polymerizable repeating unit is derived from one compound selected from the group consisting of methacrylic acid, methyl methacrylonitrile and methyl isopropenyl ketone.

* * * * *